(12) United States Patent
Zhang

(10) Patent No.: US 12,183,657 B2
(45) Date of Patent: Dec. 31, 2024

(54) ON-CHIP PELTIER COOLING DEVICE AND MANUFACTURING METHOD THEREOF

(71) Applicant: MONTAGE TECHNOLOGY CO., LTD., Shanghai (CN)

(72) Inventor: Xiong Zhang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 435 days.

(21) Appl. No.: 17/836,351

(22) Filed: Jun. 9, 2022

(65) Prior Publication Data

US 2022/0399247 A1 Dec. 15, 2022

(30) Foreign Application Priority Data

Jun. 9, 2021 (CN) .......................... 202110642608.4

(51) Int. Cl.
*H01L 23/38* (2006.01)
*H01L 23/367* (2006.01)

(52) U.S. Cl.
CPC ............ *H01L 23/38* (2013.01); *H01L 23/367* (2013.01)

(58) Field of Classification Search
CPC ....... H01L 29/7831–7832; H01L 23/38; H01L 23/367
See application file for complete search history.

(56) References Cited

U.S. PATENT DOCUMENTS

| 9,773,717 | B1 | 9/2017 | Koswatta et al. | |
|---|---|---|---|---|
| 2010/0032748 | A1* | 2/2010 | Edwards | H01L 27/0211 257/369 |
| 2011/0169098 | A1* | 7/2011 | Morimoto | H01L 27/0207 257/E21.632 |
| 2015/0349022 | A1* | 12/2015 | Edwards | H01L 29/34 438/54 |
| 2019/0088666 | A1* | 3/2019 | Tsui | H01L 29/7881 |

* cited by examiner

*Primary Examiner* — Evan G Clinton
*Assistant Examiner* — Douglas Yap
(74) *Attorney, Agent, or Firm* — Oliff PLC

(57) ABSTRACT

On-chip peltier cooling devices and manufacturing methods thereof are provided. The device comprises: a first type well, a polysilicon gate and dummy gates, first type doped regions, a second type doped region, a first and second via. The dummy gate is formed as a two-segment structure with an interval, and there is no gate oxide layer between portions of the dummy gate which are far away from the interval and the semiconductor substrate. The first type doped region at least overlaps with an orthographic projection region of the first segment of the dummy gate on the semiconductor substrate. The second type doped region at least overlaps with orthographic projection regions of the polysilicon gate and the second segment of the dummy gate on the semiconductor substrate. In this application, the heat flows from inside of the device to its surface, to realize heat dissipation and cooling.

10 Claims, 11 Drawing Sheets

ON-CHIP PELTIER COOLING DEVICE AND MANUFACTURING METHOD THEREOF

TECHNICAL FIELD

This disclosure generally relates to the technical field of semiconductor, particularly to on-chip peltier cooling devices and manufacturing methods thereof.

BACKGROUND

Chips are called as "food" of modern industry, and are important basic components of information technology industry. The development of mobile phones, computer vehicles, industrial control, Internet of Things, big data, artificial intelligence and other fields is inseparable from chips. In addition to working according to designed functions, the chips will inevitably generate heat. It is important to ensure the safety and reliability of products to dissipate the heat efficiently to keep internal devices of the chips working at a safe temperature. With the increase of chip scale and speed, it is becoming more and more challenging, and innovative ideas and methods need to be introduced.

Peltier effect refers to a phenomenon of heat absorption and heat release at joints of different conductors when current flows through a loop composed of different conductors. Existing designs based on metal Peltier effect, usually have a weak cooling effect and are incompatible with existing semiconductor CMOS processes, which also requires an additional cooling mode and brings inconvenience to the application. Therefore, there is a need to provide an on-chip peltier cooling device to achieve better process compatibility and cooling effect.

SUMMARY OF THE INVENTION

An object of the present application is to provide on-chip peltier cooling devices and manufacturing methods thereof, which provides peltier devices compatible with the existing CMOS processes and improves the cooling effect.

In one aspect of the present application, an on-chip peltier cooling device is provided, and the device comprises:
- a first type well located in a semiconductor substrate;
- a polysilicon gate and dummy gates located on the surface of the semiconductor substrate, the dummy gate forming as a two-segment structure with an interval, wherein there is no gate oxide layer between portions of the dummy gate which are far away from the interval and the semiconductor substrate;
- first type doped regions located in the first type well, the first type doped region at least overlaps with an orthographic projection region of a first segment of the dummy gate on the semiconductor substrate;
- a second type doped region located in the first type well, the second type doped region at least overlaps with orthographic projection regions of the polysilicon gate and second segments of the dummy gates on the semiconductor substrate; and
- a first via located on the first segment and a second via located on the second segment.

In some embodiments, the device further includes: a first tri-state control gate connected to the first via and a second tri-state control gate connected to the second via, wherein an output terminal of the first tri-state control gate is connected to the first via, a first input terminal and a second input terminal of the first tri-state control gate are respectively connected to a first control signal and a first enable signal, an output terminal of the second tri-state control gate is connected to the second via, and a first input terminal and a second input terminal of the second tri-state control gate are respectively connected to a second control signal and a second enable signal.

In some embodiments, the device comprises a normal mode, a cooling mode and a heating mode, wherein when the first and second enable signals are both at low levels, the device is in the normal mode; when the first and second enable signals are both at high levels, the first control signal is at low levels, and the second control signal is at high levels, the device is in the cooling mode; when the first and second enable signals are both at a high level, the second control signal is at a low level, and the first control signal is at a high level, the device is in the heating mode.

In another aspect of the present application, an on-chip peltier cooling device is provided, and the device comprises:
- a first type well and a second type well located adjacent to each other in a semiconductor substrate;
- a first polysilicon gate and first dummy gates located on the first type well, and a second polysilicon gate and second dummy gates located on the second type well, wherein the first dummy gate and the second dummy gate are respectively formed as a two-segment structure with an interval, wherein there is no gate oxide layer between portions of the dummy gate which are far away from the interval and the semiconductor substrate, and the second segment of the first dummy gate is connected to the second segment of the second dummy gate;
- first type doped regions located in the semiconductor substrate, the first type doped regions at least overlap with an orthographic projection region of first segments of the first dummy gates on the semiconductor substrate and orthographic projection regions of the second polysilicon gate and the second segments of the second dummy gates on the semiconductor substrate, and the first segment of the first dummy gate is doped as the first type;
- second type doped regions located in the semiconductor substrate, the second type doped regions at least overlap with orthographic projection regions of first segments of the second dummy gates on the semiconductor substrate and orthographic projection regions of the first polysilicon gate and the second segments of the first dummy gates on the semiconductor substrate, and the second segment of the second dummy gate is doped as the second type; and
- a first via located on the first segment of the first dummy gate and a second via located on the first segment of the second dummy gate.

In another aspect of the present application, a method for manufacturing an on-chip peltier cooling device is provided, and the method comprises:
- forming a gate oxide layer on a first type well in a semiconductor substrate, wherein the gate oxide layer exposes a portion of the first type well;
- forming a polysilicon gate and dummy gates on the first type well, and the dummy gate is formed as a two-segment structure with an interval, wherein there is no gate oxide layer between portions of the dummy gate which are far away from the interval and the semiconductor substrate, and the interval is located on the portion of the first type well which is exposed;
- forming first type doped regions in the first type well, the first type doped region at least overlaps with orthographic projection regions of a first segment of the dummy gate on the semiconductor substrate, and the first segment of the dummy gate is doped as the first type;

forming a second type doped region in the first type of well, and the second type doped region at least overlaps with orthographic projection regions of the polysilicon gate and second segments of the dummy gates on the semiconductor substrate, and the second segment of the dummy gate is doped as the second type; and forming a first via on the first segment and a second via on the second segment, respectively.

DETAILED DESCRIPTION

In the following description, numerous technical details are set forth in order to provide readers with a better understanding of the present application. However, those skilled in the art can understand that the technical solutions claimed in the present application can be implemented without these technical details and various changes and modifications based on the following embodiments.

In the following, several different embodiments are given according to different features of the present application. The specific elements and arrangements of the present application are for simplicity, but the present application is not limited to these embodiments. For example, the description of forming a first element on a second element may include embodiments in which the first element is in direct contact with the second element, as well as embodiments in which additional elements are formed between the first element and the second element such that the first element and the second element are indirectly contact. In addition, for the sake of simplicity, the present application is represented by repeated element symbols and/or letters in different examples, but does not mean that there is a specific relationship between the examples and/or structures. It is important to understand that when a layer is "on" another layer or substrate, it may mean that it is directly on the other layer or substrate, or that other layer is sandwiched between other layers or substrates.

Embodiment I

Figure 1:
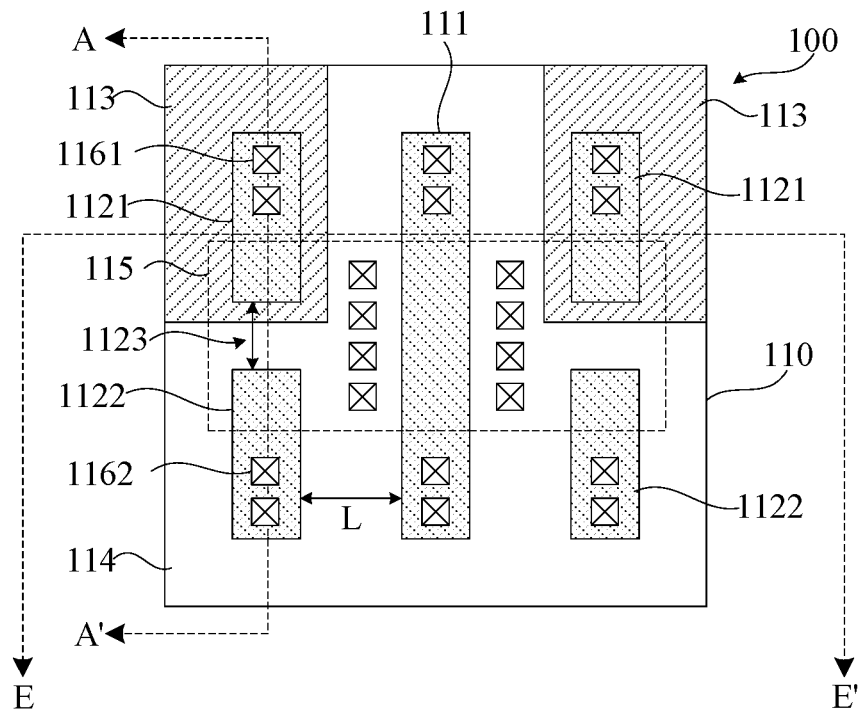
FIG. 1 shows a top view of an on-chip peltier cooling device in an embodiment of the present application.

An embodiment of the present application discloses an on-chip peltier cooling device. FIG. 1 shows a top view of the on-chip peltier cooling device 100. The device 100 comprises: a first type well 110 located in a semiconductor substrate (not shown), a polysilicon gate 111 and dummy gates on a surface of the semiconductor substrate, first type doped regions 113 located in the first type well 110, and a second type doped region 114 located in the first type well 110. The polysilicon gate 111 is located between two dummy gates. In some embodiments, the polysilicon gate 111 and the dummy gates may be parallel to each other. In some embodiments, the polysilicon gate 111 and the dummy gates may not be parallel to each other and spaced apart from each other. The dummy gate may be formed as a two-segment structure, including a first segment 1121 and a second segment 1122, and there is an interval 1123 between the first segment 1121 and the second segment 1122. The device 100 also includes a first via(s) 1161 located on the first segment 1121 and a second via(s) 1162 located on the second segment 1122.

In one embodiment, the polysilicon gate and the dummy gate are formed in one process. Considering the proximity effect, the distance L between the polysilicon gate 111 and the dummy gates should be greater than a threshold to avoid affecting the threshold voltage of transistor. For example, for a 40 nm process, the distance L is greater than 0.5 microns. For the sake of simplicity, some reference signs of parts are omitted in FIG. 1.

The first type doped region 113 at least overlaps with the orthographic projection region of the first segment 1121 of the dummy gate on the semiconductor substrate, and the first segment 1121 of the dummy gate is doped as the first type. The second type doped region 114 at least overlaps with the orthographic projection regions of the polysilicon gate 111 and the second segments 1122 of the dummy gates on the semiconductor substrate, and the first segment 1122 of the dummy gate is doped as the second type. As shown in FIG. 1, the second type doped region 114 is located in a majority portion of the first type well 110, the first type doped regions 113 are located in the remaining portion of the first type well 110, the polysilicon gate 111 and the second segments 1122 of the dummy gates are formed on a portion of the second type doped region 114, and the first segment 1121 of the dummy gate is formed on a portion of the first type doped region 113. In one embodiment, the first type is N-type and the second type is P-type. In the device 100, P-type doped regions are formed in an N-type well, and the P-type doped regions are respectively used as a source region and a drain region, thereby forming a PMOS transistor structure. It should be noted that the dashed box 115 in FIG. 1 is the active area of the device 100, and the area surrounding the active area is formed for shallow trench isolation (STI).

In one embodiment, there is a gate oxide layer between the polysilicon gate 111 and the semiconductor substrate, and there is no gate oxide layer between portions of the dummy gate which are far away from the interval 1123 and the semiconductor substrate.

It should be understood that the device 100 in this embodiment further comprises multi-layer metal interconnect lines for interconnecting with the vias, which are not described herein.

Figure 2:
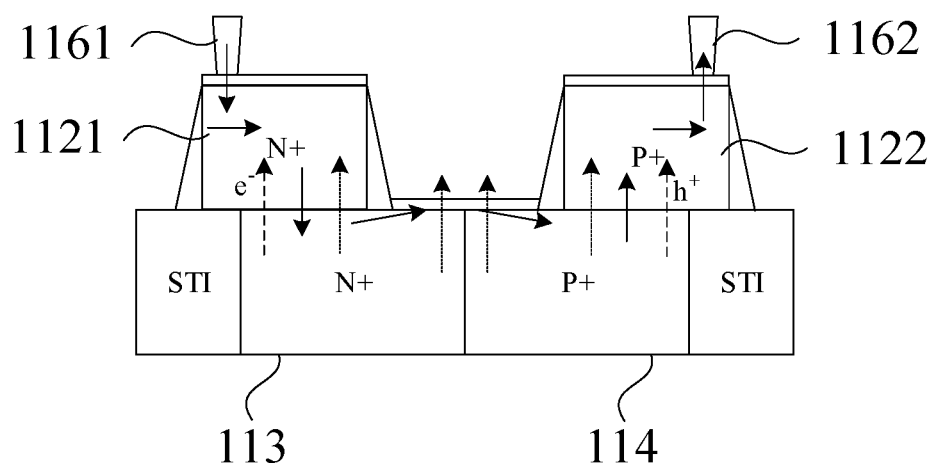
FIG. 2 shows a cross-sectional view of an on-chip peltier cooling device in an embodiment of the present application.

FIG. 2 shows a simplified cross-sectional view of the on-chip peltier cooling device 100 along AA' direction. It should be noted that the partial structures in FIG. 1 are omitted in FIG. 2 for clarity reasons. It should be noted that, in FIG. 2, sidewalls are formed around the dummy gates 1121, 1122, and silicides are formed on the surfaces of the dummy gates 1121, 1122 and the well 110, which is well known to those skilled in the art and will not be elaborated here. In an embodiment, a high level is applied to the via 1161, a low level or ground is applied to the via 1162, and current flows from the via 1161 through the first segment 1121 of the dummy gate to the first type doped region 113 (as shown by solid arrow in the FIG. 2). The first segment 1121 of the dummy gate and the first type doped region 113 are both N-type doped, the carriers of which are electrons $e^-$, and the flow direction of the carriers $e^-$ is from the first type doped region 113 to the first segment 1121. The current flows from the first type doped region 113 to the second type doped region 114, and then from the second type doped region 114 to the second segment 1122 of the dummy gate. Both the second type doped region 114 and the second segment 1122 are P-type doped, the carriers of which are hole $h^+$, and the flow direction of the carriers $h^+$ is from the second type doped region 114 to the second segment 1122. Inside the device 100, the flow direction of the heat is the same as the flow direction of the carriers. Therefore, the flow direction of the heat is sequentially from the first type doped region 113 to the first segment 1121, and from the second type doped region 114 to the second segment 1122. That is, the heat flows from the inside of the device to its surface, so as to achieve heat dissipation and cooling.

Figure 3:
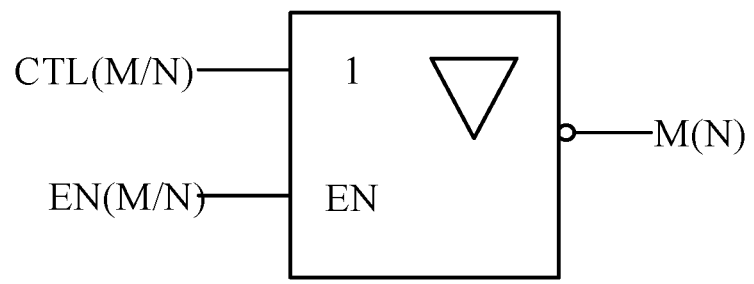
FIG. 3 shows a schematic diagram of a tri-state control gate in an embodiment of the present application.

In other embodiments, the device 100 further includes a first tri-state control gate connected to the first via 1161 and a second tri-state control gate connected to the second via 1162. The structure of the tri-state control gate is shown in FIG. 3. The output terminal of the tri-state control gate is connected to the via, and the two input terminals are respectively connected to the control signal and the enable signal. Specifically, the output terminal M of the first tri-state control gate is connected to the first via 1161, the first input terminal and the second input terminal of the first tri-state control gate are respectively connected to the first control signal CTL(M) and the first enable signal EN(M). The output terminal N of the second tri-state control gate is connected to the second via 1162, the first input terminal and the second input terminal of the second tri-state control gate are respectively connected to the second control signal CTL(N) and the second enable signal EN(N).

In one embodiment, a normal mode, a cooling mode and a heating mode of the device 100 can be realized by implementing different signal control on the tri-state control gates. As shown in Table 1 below, when the first enable signal EN(M) and the second enable signal EN(N) are both at low level (0), the device is in a normal mode, that is, both output terminals M and N are in a high impedance state, and there is no current, and the device is in the normal operation mode. When the first enable signal EN(M) and the second enable signal EN(N) are both at high level (1), the first control signal CTL(M) is at a low level (0), and the second control signal CTL(N) is at a high level (1), the device is in a cooling mode, that is, the current flows from the terminal M to the terminal N to realize the heat dissipation and cooling function as described above. When the first enable signal EN(M) and the second enable signal EN(N) are both at high level (1), the second control signal CTL(N) is at low level (0), and the first control signal CTL(M) is at high level (1), the device is in a heating mode, that is, the current flows from the output terminal N to the output terminal M, which is opposite to that in the cooling mode, the heat flow flows from the surface of the device to its inside to realize the heating function. The "–" in Table 1 indicates a high level or a low level, that is, in the normal mode, both the first enable signal EN(M) and the second enable signal EN(N) are in low level (0), the tri-state control gates are not turned on, and the first control signal CTL(M) and the second control signal CTL(N) do not matter whether they are at a high level or a low level. It should be understood that the operation modes of the device 100 can be selected according to the actual situation. For example, when the chip is not overheated, it can be selected to the normal operation mode to maximize performance; when the chip is threatened by overheating, it can be switched to the cooling mode to reduce the junction temperature and return to the safe operation temperature range; and when the chip is in a low temperature environment, the heating mode can be enabled to ensure normal operation.

TABLE 1

Control Device Modes Using Tri-State Control Gates

|  | CTL(M) | CTL(N) | EN(M) | EN(N) |
|---|---|---|---|---|
| Normal mode | — | — | 0 | 0 |
| Cooling mode | 0 | 1 | 1 | 1 |
| Heating mode | 1 | 0 | 1 | 1 |

Embodiment II

Figure 4:
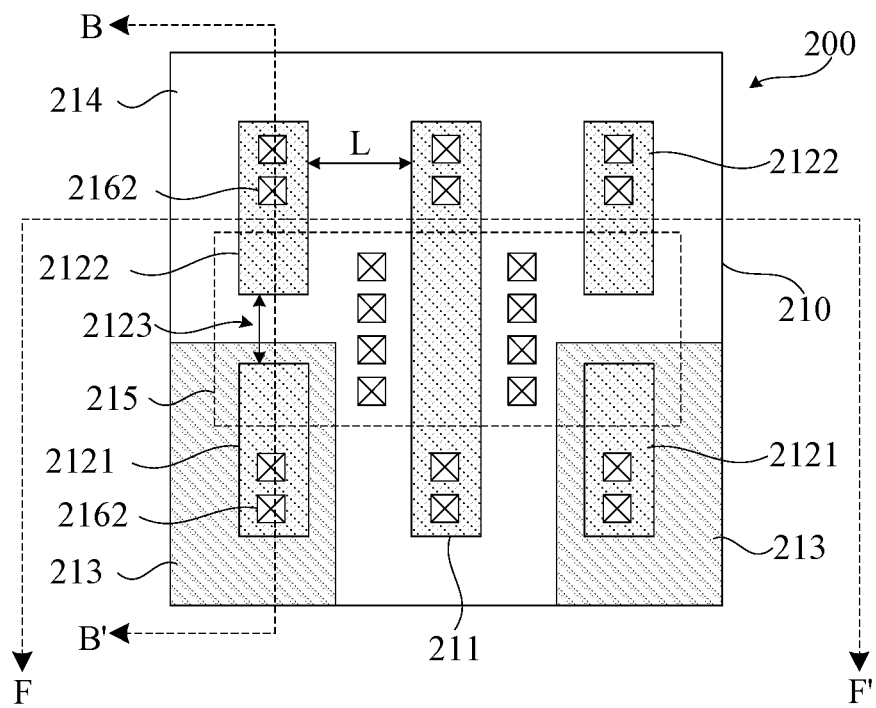
FIG. 4 shows a top view of an on-chip peltier cooling device in other embodiment of the present application.

FIG. 4 shows a top view of an on-chip peltier device 200 in another embodiment. The device 200 includes a second type well 210 in a semiconductor substrate (not shown), a polysilicon gate 211 and dummy gates on a surface of the semiconductor substrate, second type doped regions 213 in the second type well 210, and a first type doped region 214 in the second type well 210. The dummy gate is formed as a two-segment structure, including a first segment 2121 and a second segment 2122, and there is an interval 2123 between the first segment 2121 and the second segment 2122. The device 200 also includes a first via(s) 2161 located on the first segment 2121 and a second via(s) 2162 located on the second segment 2122.

The second type doped region 213 at least overlaps with the orthographic projection region of the first segment 2121 of the dummy gate on the semiconductor substrate. The first type doped region 214 at least overlaps with the orthographic projection regions of the polysilicon gate 211 and the second segments 2122 of the dummy gates on the semiconductor substrate. As shown in FIG. 4, the first type doped region 214 is located in a majority portion of the second type well 210, the second type doped regions 213 are located in the remaining portion of the second type well 210, the polysilicon gate 211 and the second segments 2122 of the dummy gates are formed on a portion of the first type doped region 214, and the first segment 2121 of the dummy gate is formed on a portion of the second type doped region 213. In one embodiment, the first type is N-type and the second type is P-type. In the device 200, N-type doped regions are formed in a P-type well, and the N-type doped regions are used as a source region and a drain region, respectively, thereby forming a NMOS transistor structure. It should be noted that the dashed box 215 in FIG. 4 is the active area of the device 200, and the area surrounding the active area is formed for shallow trench isolation (STI).

In this embodiment, the cross-sectional structure of the device 200 along the BB' direction is similar to the cross-sectional structure of the device 100 along the AA' direction (i.e., FIG. 2), and its working principle is the same or similar to that of the above embodiment, which is not repeated here. In this embodiment, the heat flows from the inside of the device to its surface, thereby achieving heat dissipation and cooling.

Embodiment III

Figure 5:
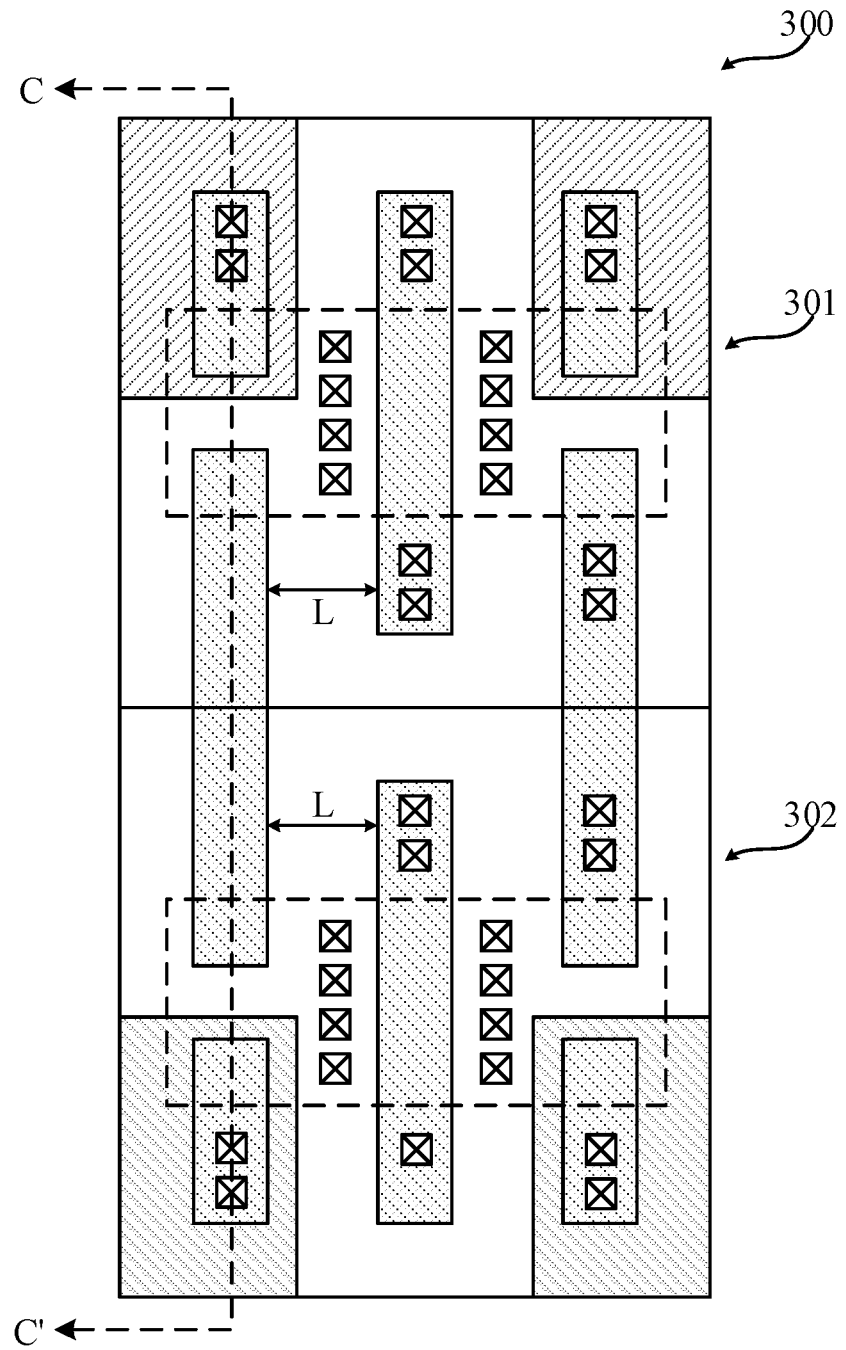
FIG. 5 shows a top view of an on-chip peltier cooling device in another embodiment of the present application.

FIG. 5 shows a top view of an on-chip peltier device 300 in another embodiment. The device 300 includes a first component 301 and a second component 302, the component 301 may be a PMOS transistor, the structure of which can refer to that shown in FIG. 1. The component 302 may be an NMOS transistor, the structure of which can refer to that shown in FIG. 4.

The component 301 includes a first type well, a first polysilicon gate and first dummy gates. The component 302 includes a second type well, a second polysilicon gate and second dummy gates. The second segment of the first dummy gate in the component 301 is connected to the corresponding second segment of the second dummy gate in the component 302.

The first type doped regions at least overlap with orthographic projection regions of the first segments of the first dummy gates in the component 301 on the semiconductor substrate, and the orthographic projection regions of the second polysilicon gate and the second segments of the second dummy gates in the component 302 on the semiconductor substrate. In addition, the first segment of the first dummy gate is doped as the first type. In one embodiment, the area covered by the first type doped region is equal to the area of the second type well. The second type doped regions at least overlap with the orthographic projection regions of the first segments of the second dummy gates in the component 302 on the semiconductor substrate, and the orthographic projection regions of the first polysilicon gate and the second segments of the first dummy gates in the component 301 on the semiconductor substrate. In addition, the second segment of the second dummy gate is doped as the second type. In one embodiment, the area covered by the second type doped region is equal to the area of the first type of well.

Figure 6:
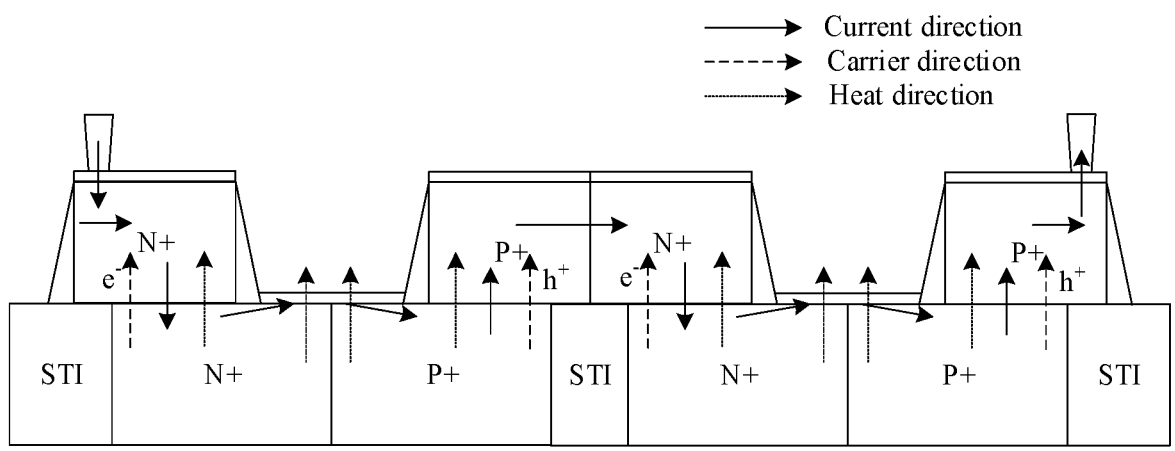
FIG. 6 shows a cross-sectional view of an on-chip peltier cooling device in another embodiment of the present application.

FIG. 6 shows a simplified cross-sectional view of the on-chip peltier cooling device 300 along the CC' direction. It should be noted that the partial structures in FIG. 5 are omitted in FIG. 6 for clarity reasons. The current direction, the carrier direction and the heat flow direction in the device of this embodiment are shown in FIG. 6, and the working principle thereof is the same or similar to that of the above embodiments, and will not be repeated here. In this embodiment, the heat flows from the inside of the device to its surface, so as to realize heat dissipation and cooling.

Embodiment IV

Figure 7A:
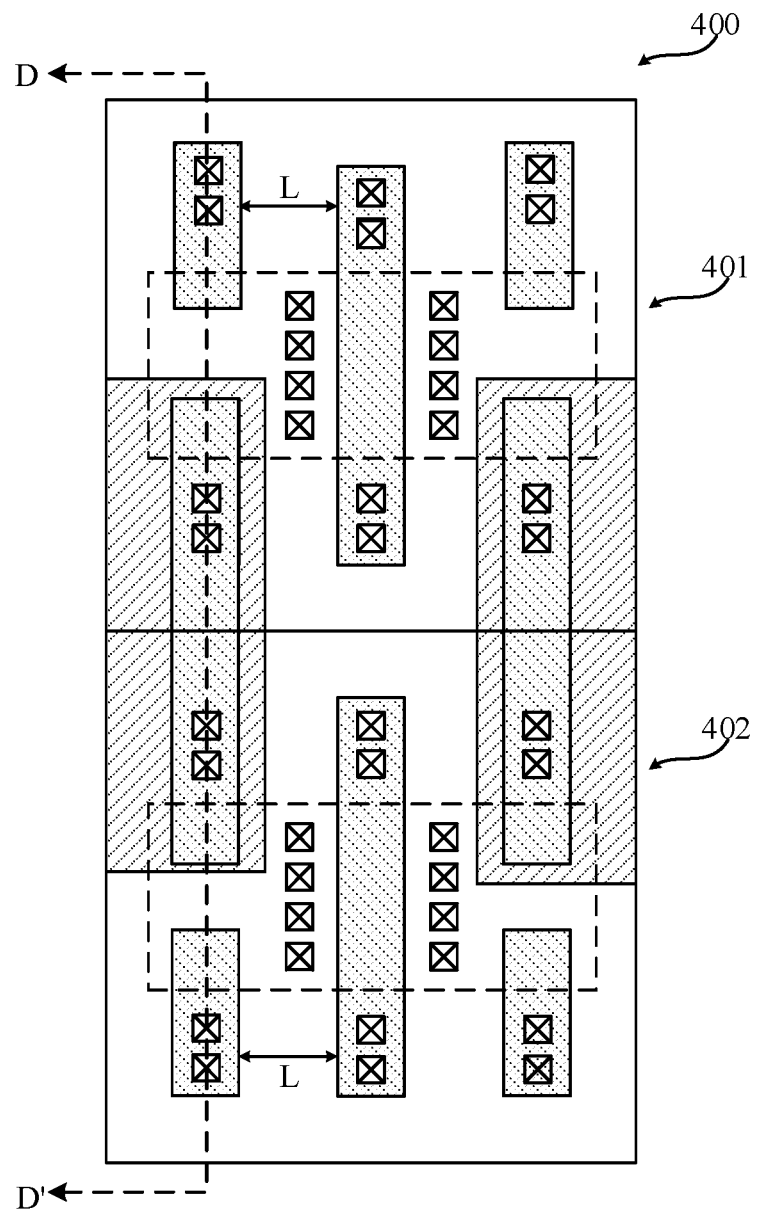
FIG. 7(a) shows a top view of an on-chip peltier cooling device in another embodiment of the present application.

FIG. 7(a) shows a top view of an on-chip peltier device 400 in another embodiment. The device 400 includes a first component 401 and a second component 402. The components 401 and 402 are both PMOS transistors, the structure of which can refer to that shown in FIG. 1. Each of the components 401 and 402 includes a first type well, a polysilicon gate, and dummy gates, wherein the first segment of the dummy gate in the component 401 is connected to the first segment of the dummy gate in the component 402.

Figure 7B:
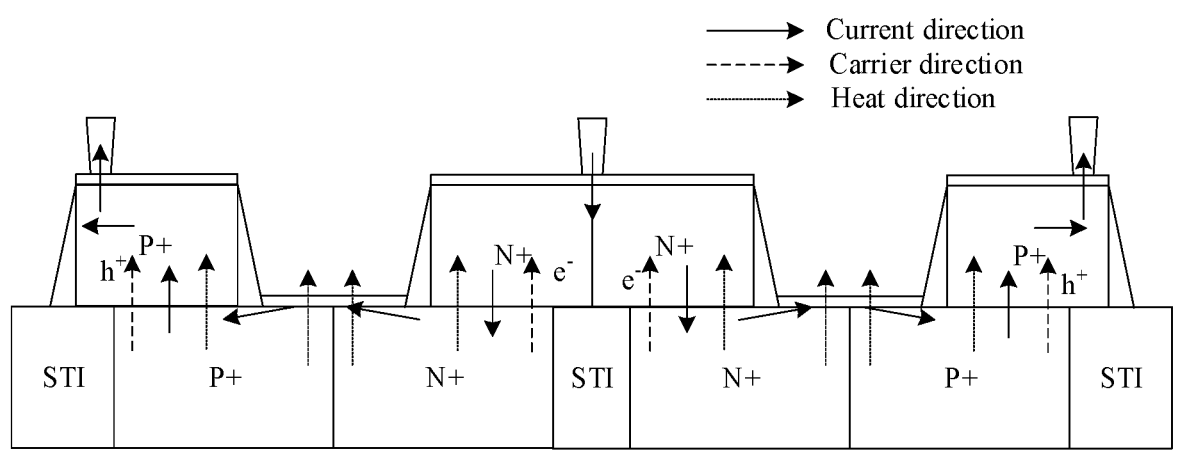
FIG. 7(b) shows a cross-sectional view of an on-chip peltier cooling device in another embodiment of the present application.

In this embodiment, FIG. 7(b) shows a simplified cross-sectional view of the on-chip peltier cooling device 400 along the DD' direction, and its working principle is the same or similar to that of the above embodiments, which is not repeated here. In this embodiment, the heat flows from the inside of the device to its surface, thereby achieving heat dissipation and cooling.

Embodiment V

Figure 8:
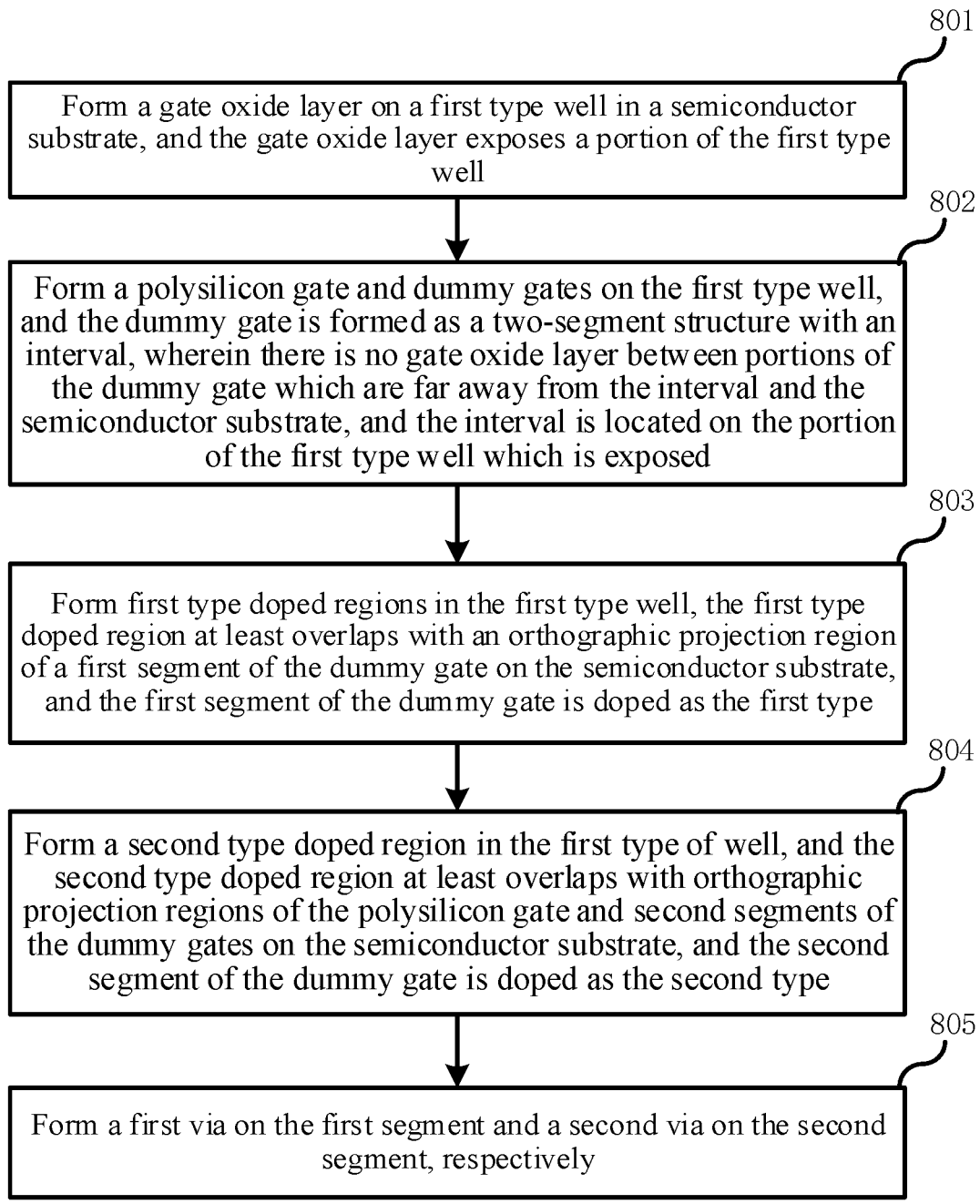
FIG. 8 shows a flow chart of a method for manufacturing an on-chip peltier cooling device in an embodiment of the present application.
Figure 9A:
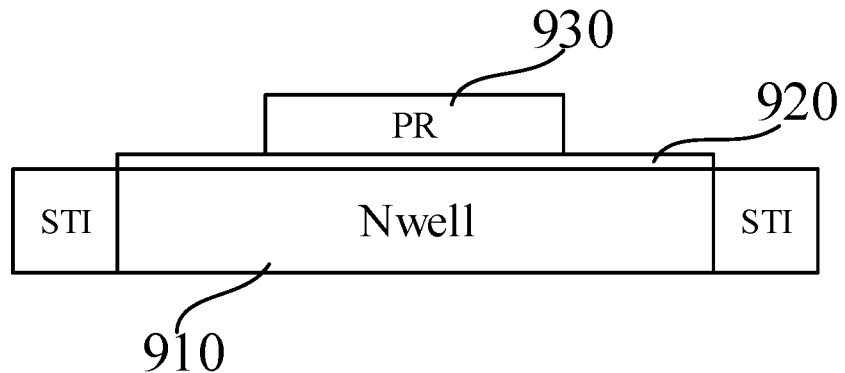
FIGS. 9(a) to 9(e) are schematic structural diagrams of various steps of a method for manufacturing an on-chip peltier cooling device in an embodiment of the present application.

The present application also discloses a method for manufacturing an on-chip peltier cooling device. FIG. 8 shows a flow chart of the manufacturing method, which may form, for example, the device 100 shown in FIG. 1 and the device 200 shown in FIG. 4. The method is described in conjunction with FIGS. 9(a)-9(e). It should be noted that FIGS. 9(a)-9(e) correspond to the cross-section of the device 100 along the EE' direction or the device 200 along the FF' direction. The method includes the following steps:

In step 801, as shown in FIG. 9(a), a gate oxide layer 920 is formed on a first type well 910 in a semiconductor substrate (not shown), a patterned photoresist 930 is formed on the gate oxide layer 920, and the gate oxide layer 920 is etched so that a portion of the first type well may be exposed by the gate oxide layer 920.

Figure 9B:
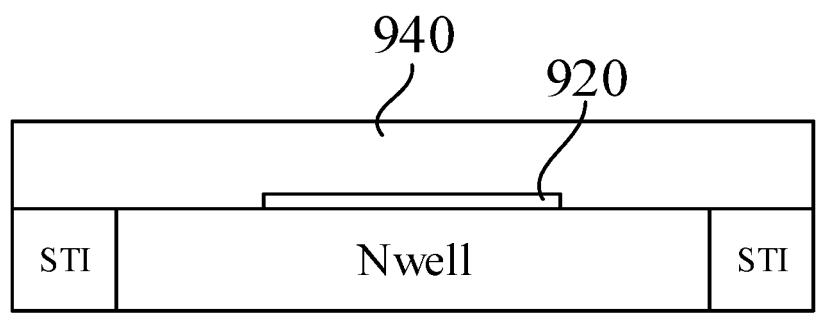
Figure 9C:
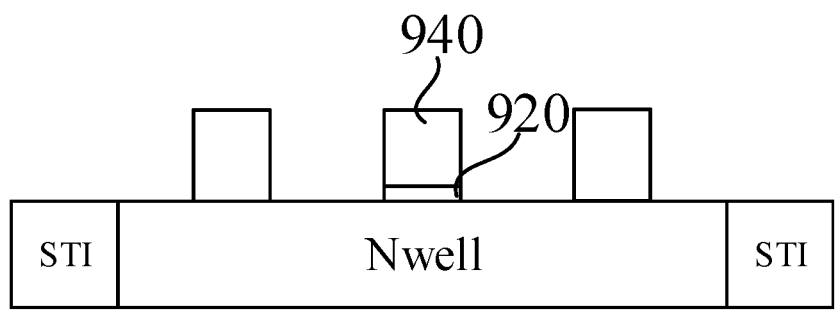

In step 802, as shown in FIG. 9(b), a polysilicon 940 is formed on the first type well 910, and the polysilicon 940 is etched to form a polysilicon gate and dummy gates, as shown in FIG. 9(c). In addition, the method may further include removing the gate oxide layer outside the polysilicon gate region. The dummy gate is formed as a two-segment structure with an interval, wherein there is no gate oxide layer between portions of the dummy gate which are far away from the interval and the semiconductor substrate, and the interval is located on the exposed portion of the first type well.

Figure 9D:
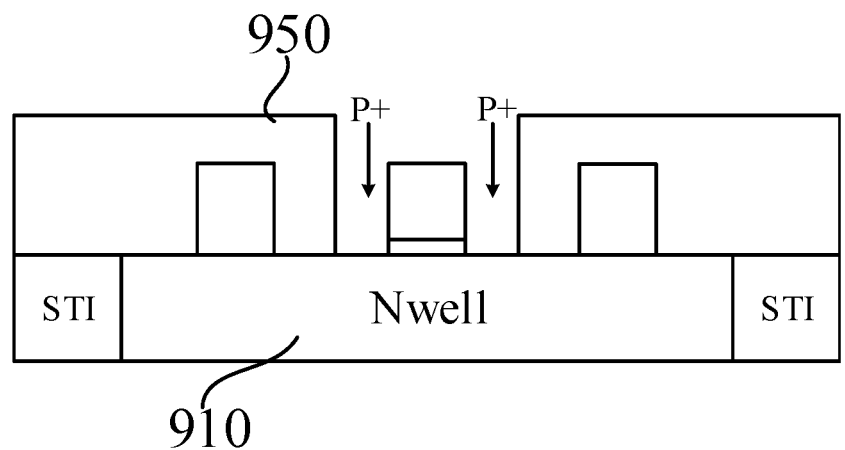

In step 803, as shown in FIG. 9(d), a patterned photoresist 950 is formed on the first type well 910, and P-type ion implantation is performed on the first type well 910 to form the first type doped regions in the first type well 910. The first type doped region at least overlaps with the orthographic projection region of the first segment of the dummy gate on the semiconductor substrate. In addition, the first segment of the dummy gate is doped as the first type. Then, the patterned photoresist 950 is removed.

Figure 9E:
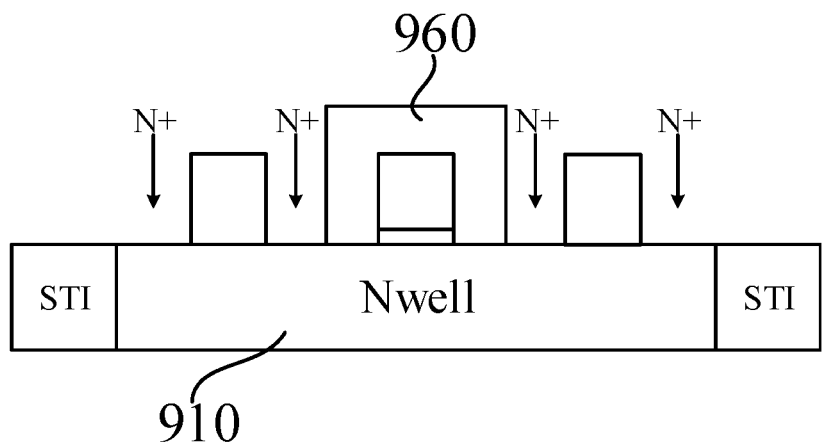

In step 804, as shown in FIG. 9(e), a patterned photoresist 960 is formed on the first type well 910, and N-type ion implantation is performed on the first type well 910 to form the second type doped region in the first type well 910. The second type doped region at least overlaps with the orthographic projection region of the polysilicon gate and the second segments of the dummy gates on the semiconductor substrate. In addition, the second segment of the dummy gate is doped as the second type. Then, the patterned photoresist 960 is removed.

In step 805, a first via(s) is formed on the first segment and a second via(s) is formed on the second segment, respectively.

In this embodiment, compared with the existing CMOS process, only one photolithography and etching process needs to be added to remove the gate oxide layer between the dummy gates and the semiconductor substrate. Furthermore, in the polysilicon patterning process and the P-type and N-type ion implantation processes, only the pattern design in the layout needs to be modified, and no additional photolithography process needs to be added.

Embodiment VI

Figure 10:
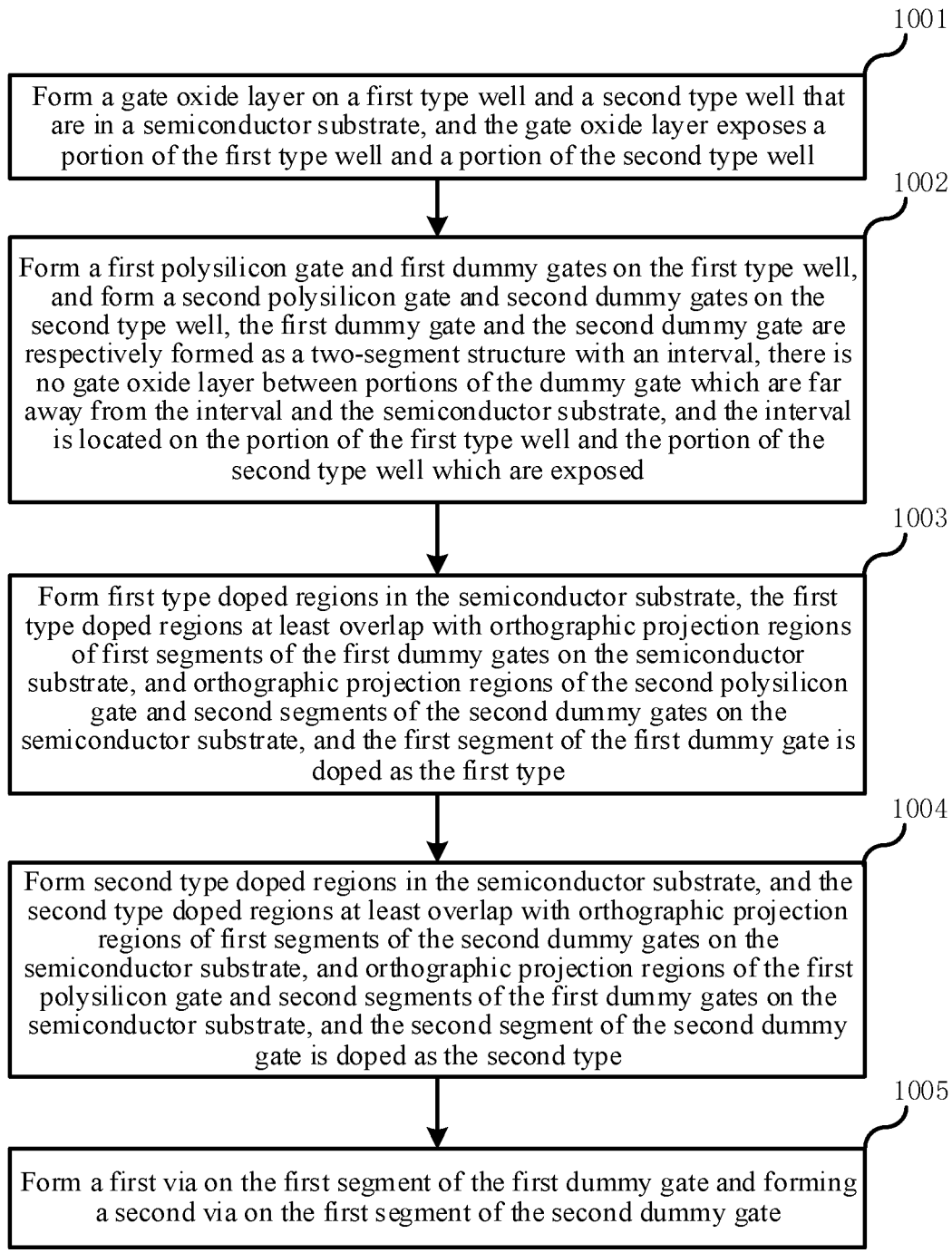
FIG. 10 shows a flow chart of a method for manufacturing an on-chip peltier cooling device in another embodiment of the present application.

The present application also discloses a method for manufacturing an on-chip peltier cooling device. FIG. 10 shows a flow chart of the manufacturing method, which can form the device 300 shown in FIG. 5. The method is described in conjunction with FIGS. 11(a), 11(b), 12(a) and 12(b), which includes the following steps:

In step 1001, a gate oxide layer is formed on a first type well and a second type well that are in a semiconductor substrate, and the gate oxide layer exposes a portion of the first type well and a portion of the second type well.

In step 1002, a first polysilicon gate and first dummy gates are formed on the first type well, and a second polysilicon gate and second dummy gates are formed on the second type well. The first dummy gate and the second dummy gate are respectively formed as a two-segment structure with an interval, wherein there is no gate oxide layer between portions of the two-segment structure which are far away from the interval and the semiconductor substrate. The intervals are located on the exposed portion of the first type well and the exposed portion of the second type well.

In one embodiment, a second segment of the first dummy gate is connected with a second segment of the second dummy gate.

In step 1003, first type doped regions are formed in the semiconductor substrate, the first type doped regions at least overlap with the orthographic projection region of the first segments of the first dummy gates on the semiconductor substrate, and the orthographic projection regions of the second polysilicon gate and the second segments of the second dummy gates on the semiconductor substrate. In addition, the first segment of the first dummy gate is doped as the first type.

In step 1004, second type doped regions are formed in the semiconductor substrate, the second type doped regions at least overlap with the orthographic projection region of the first segments of the second dummy gates on the semiconductor substrate, and the orthographic projection regions of the first polysilicon gate and the second segments of the first dummy gates on the semiconductor substrate. In addition, the second segment of the second dummy gate is doped as the second type.

Figure 11A:
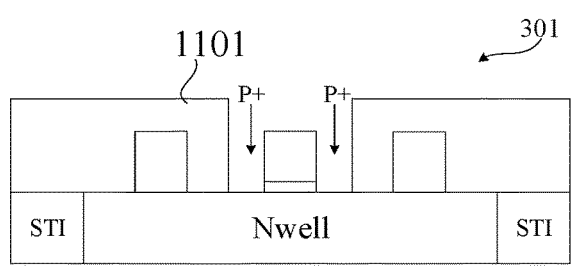
FIGS. 11(a) and 11(b) are schematic structural diagrams of performing P-type implantation of a method for manufacturing an on-chip peltier cooling device in another embodiment of the present application.
Figure 11B:
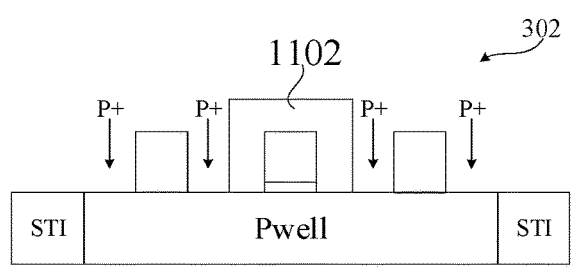
Figure 12A:
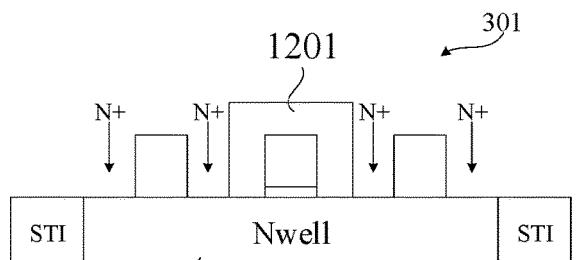
FIGS. 12(a) and 12(b) are schematic structural diagrams of performing N-type implantation of a method for manufacturing an on-chip peltier cooling device in another embodiment of the present application.
Figure 12B:
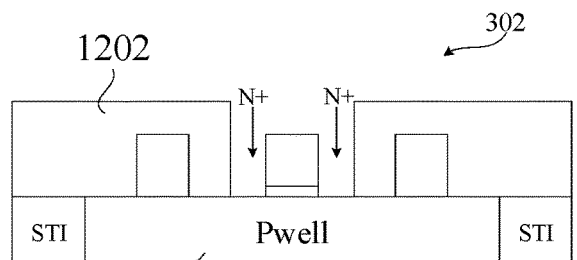

FIG. 11(a) and FIG. 11(b) are schematic diagrams of P-type ion implantation in PMOS transistor 301 and NMOS transistor 302, respectively. FIG. 12(a) and FIG. 12(b) are schematic diagrams of N-type ion implantation in PMOS transistor 301 and NMOS transistor 302, respectively. In the traditional CMOS process, only P-type ion implantation is required to form the PMOS transistor, and only N-type ion implantation is required to form the NMOS transistor. In this application, P-type ion implantation is also performed in the P-type well region when P-type ion implantation is performed in the N-type well region, and N-type ion implantation is also performed in the N-type well region when N-type ion implantation is performed in the P-type well region, so as to form the peltier structure in PMOS transistor and NMOS transistor, respectively, thereby realizing heat dissipation and cooling. In the P-type and N-type ion implantation processes of this embodiment, only the pattern design in the layout needs to be modified, and no additional photolithography process needs to be added.

In step 1005, a first via(s) is formed on the first segment of the first dummy gate and a second via(s) is formed on the first segment of the second dummy gate.

According to the data found on commercial semiconductor cooling chips, a chip with an area of about 8 mm×8 mm can have a 67° C. temperature difference between its two ends at a current of 2.5 A and a voltage of 0.85 V. Roughly calculate according to the ratio, for a chip with an area of 100 um×100 um, if the methods of the present application are introduced to implement cooling, the required current is 2.5/(8*8*10*10)=0.39 mA. If only a temperature difference of about 20° C. is required, then the required current is only 0.12 mA. Even a chip with an area of 1 $mm^2$ needs to achieve such an effect, the required current is only 12 mA, and the required power is 10 mW. Considering that the height of P+/N+ polysilicon in the chip is much less than 4 mm, and the thermal conduction path is much shorter, the actual thermal conduction efficiency should be better than this calculation. Using the principle of the present application, considerable junction temperature rapid cooling effect can be achieved on the chip with negligible additional power consumption.

In the implementation of the present application, the heat flows from the inside of the device to the surface, so as to realize heat dissipation and cooling. Because the Seebeck coefficient of N+/P+ of semiconductor materials is relatively large, which is about 30 times larger than that of metal materials, only 1/30 of the current is needed to achieve the same effect as metal-based peltier devices.

Compared with the existing CMOS process, only one photolithography and etching process needs to be added to remove the gate oxide layer between the dummy gates and the semiconductor substrate. Furthermore, in the polysilicon patterning process and the P-type and N-type ion implantation processes, only the pattern design in the layout needs to be modified, and no additional photolithography process needs to be added. The implementation of the present application is fully compatible with the existing CMOS process, does not introduce special materials and processes, and has full feasibility.

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results. In some embodiments, multitasking and parallel processing are also possible or may be advantageous.

What is claimed is:

1. An on-chip peltier cooling device, comprising:
a first type well located in a semiconductor substrate;
a polysilicon gate and dummy gates located on the surface of the semiconductor substrate, the dummy gate forming as a two-segment structure with an interval, wherein there is no gate oxide layer between portions of the dummy gate which are far away from the interval and the semiconductor substrate;
first type doped regions located in the first type well, the first type doped region at least overlaps with an orthographic projection region of a first segment of the dummy gate on the semiconductor substrate;
a second type doped region located in the first type well, the second type doped region at least overlaps with orthographic projection regions of the polysilicon gate and second segments of the dummy gates on the semiconductor substrate; and
a first via located on the first segment and a second via located on the second segment.

2. The on-chip peltier cooling device of claim 1, further comprising: a first tri-state control gate connected to the first via and a second tri-state control gate connected to the second via, wherein an output terminal of the first tri-state control gate is connected to the first via, a first input terminal and a second input terminal of the first tri-state control gate are respectively connected to a first control signal and a first enable signal, an output terminal of the second tri-state control gate is connected to the second via, and a first input terminal and a second input terminal of the second tri-state control gate are respectively connected to a second control signal and a second enable signal.

3. The on-chip peltier cooling device of claim 2, wherein the device comprises a normal mode, a cooling mode and a heating mode, wherein when the first and second enable signals are both at low levels, the device is in the normal mode; when the first and second enable signals are both at high levels, the first control signal is at low levels, and the second control signal is at high levels, the device is in the cooling mode; when the first and second enable signals are both at a high level, the second control signal is at a low level, and the first control signal is at a high level, the device is in the heating mode.

4. The on-chip peltier cooling device of claim 1, wherein the first segments of the dummy gates are doped as the first type.

5. The on-chip peltier cooling device of claim 1, wherein the second segments of the dummy gates are doped as the second type.

6. The on-chip peltier cooling device of claim 1, wherein a distance between the polysilicon gate and the dummy gate is greater than 0.5 μm.

7. An on-chip peltier cooling device, comprising:
a first type well and a second type well located adjacent to each other in a semiconductor substrate;
a first polysilicon gate and first dummy gates located on the first type well, and a second polysilicon gate and second dummy gates located on the second type well, wherein the first dummy gate and the second dummy gate are respectively formed as a two-segment structure with an interval, wherein there is no gate oxide layer between portions of the dummy gate which are far away from the interval and the semiconductor substrate, and the second segment of the first dummy gate is connected to the second segment of the second dummy gate;
first type doped regions located in the semiconductor substrate, the first type doped regions at least overlap with orthographic projection regions of first segments of the first dummy gates on the semiconductor substrate and orthographic projection regions of the second polysilicon gate and the second segments of the second dummy gates on the semiconductor substrate, and the first segment of the first dummy gate is doped as the first type;
second type doped regions located in the semiconductor substrate, the second type doped regions at least overlap with orthographic projection regions of first segments of the second dummy gates on the semiconductor substrate and orthographic projection regions of the first polysilicon gate and the second segments of the first dummy gates on the semiconductor substrate, and the second segment of the second dummy gate is doped as the second type; and
a first via located on the first segment of the first dummy gate and a second via located on the first segment of the second dummy gate.

8. The on-chip peltier cooling device of claim 7, wherein an area covered by the first type doped region is equal to an area of the second type well.

9. The on-chip peltier cooling device of claim 7, wherein an area covered by the second type doped region is equal to an area of the first type well.

10. A method for manufacturing an on-chip peltier cooling device, comprising:
forming a gate oxide layer on a first type well in a semiconductor substrate, wherein the gate oxide layer exposes a portion of the first type well;
forming a polysilicon gate and dummy gates on the first type well, and the dummy gate is formed as a two-segment structure with an interval, wherein there is no gate oxide layer between portions of the dummy gate which are far away from the interval and the semiconductor substrate, and the interval is located on the portion of the first type well which is exposed;
forming first type doped regions in the first type well, the first type doped region at least overlaps with an orthographic projection region of a first segment of the dummy gate on the semiconductor substrate, and the first segment of the dummy gate is doped as the first type;

forming a second type doped region in the first type of well, and the second type doped region at least overlaps with orthographic projection regions of the polysilicon gate and second segments of the dummy gates on the semiconductor substrate, and the second segment of the dummy gate is doped as the second type; and forming a first via on the first segment and a second via on the second segment, respectively.

\* \* \* \* \*